(12) United States Patent
Matsukawa et al.

(10) Patent No.: US 8,624,339 B2
(45) Date of Patent: Jan. 7, 2014

(54) VIBRATING DEVICE AND ELECTRONIC APPARATUS

(75) Inventors: Norihito Matsukawa, Suwa (JP); Atsushi Ono, Shiojiri (JP); Mitsuhiro Tateyama, Kamiina (JP); Tsunenori Shibata, Fujisawa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 13/556,768

(22) Filed: Jul. 24, 2012

(65) Prior Publication Data

US 2013/0026583 A1 Jan. 31, 2013

(30) Foreign Application Priority Data

Jul. 26, 2011 (JP) .................................. 2011-163705

(51) Int. Cl.
 *H01L 29/82* (2006.01)
(52) U.S. Cl.
 USPC ............................ 257/415; 257/619; 257/703
(58) Field of Classification Search
 USPC ................... 257/415, 619, 687, 703, E23.001
 See application file for complete search history.

(56) References Cited

U.S. PATENT DOCUMENTS

| | | | |
|---|---|---|---|
| 7,327,004 B2 * | 2/2008 | Hattori et al. | 257/415 |
| 7,388,287 B2 | 6/2008 | Takahashi | |
| 8,102,015 B2 * | 1/2012 | Gong et al. | 257/416 |
| 8,125,788 B2 * | 2/2012 | Hatanaka et al. | 361/764 |
| 2009/0236936 A1 * | 9/2009 | Tamura | 310/314 |

FOREIGN PATENT DOCUMENTS

| | | |
|---|---|---|
| JP | 09-089925 | 4/1997 |
| JP | 2004-158604 | 6/2004 |
| JP | 2006-261560 | 9/2006 |
| JP | 2010-256332 | 11/2010 |

\* cited by examiner

*Primary Examiner* — Phuc Dang
(74) *Attorney, Agent, or Firm* — Harness, Dickey & Pierce, P.L.C.

(57) ABSTRACT

A vibrating device has a package having an accommodating space in the interior thereof and a gyro element and an IC chip accommodated in the accommodating space. The package has a plate-like bottom plate having an IC chip mounting area and a vibrating element mounting area. The IC chip mounting area includes an IC chip mounting surface on which the IC chip is mounted. The vibrating element mounting area is arranged in parallel with the IC chip mounting area and includes a vibrating element mounting surface on which the gyro element is mounted. The thickness of the IC chip mounting area is smaller than that of the vibrating element mounting area. The IC chip mounting surface is located closer to a bottom side than the vibrating element mounting surface.

12 Claims, 11 Drawing Sheets

VIBRATING DEVICE AND ELECTRONIC APPARATUS

BACKGROUND

1. Technical Field

The present invention relates to a vibrating device and an electronic apparatus.

2. Related Art

Heretofore, vibrating devices in which a sensor chip and an IC (Integrated Circuit) are disposed within a casing have been known (for example, refer to JP-A-2006-261560 (Patent Document 1)).

A vibrating device (semiconductor package) of Patent Document 1 has a case body having a bottom plate and a frame-like side wall disposed at a peripheral edge portion of an upper surface of the bottom plate. A sensor chip such as an acceleration sensor, a signal processing chip, and a memory chip are mounted on the upper surface of the bottom plate so as to be located in a chip accommodating space formed in the interior of the case body.

Moreover, in the vibrating device of Patent Document 1, the signal processing chip and the memory chip are arranged to be overlapped with each other in the thickness direction, and the sensor chip is arranged in parallel next to them. The bottom plate is designed such that the thickness of a sensor chip mounting area in which the sensor chip is mounted is smaller than that of a signal processing chip mounting area in which the signal processing chip and the memory chip are arranged to be overlapped with each other. In other words, the bottom plate has a shape in which one portion (portion corresponding to the sensor chip mounting area) of the upper surface is recessed lower than the other portion (portion corresponding to the signal processing chip mounting area). In the recessed portion, the sensor chip is mounted. In the vibrating device of Patent Document 1, by mounting the sensor chip having a thickness greater than that of the signal processing chip or the memory chip in the recessed portion, miniaturization (reduction in profile) of the vibrating device is achieved.

In the vibrating device of Patent Document 1, however, the thickness of the sensor chip mounting area of the bottom plate is reduced, and the sensor chip is mounted in the thickness-reduced portion. The thickness-reduced portion is easy to deform (easy to strain) due to an external force or heat, compared to the other portion (signal processing chip mounting area). Then, due to deformation occurring in the portion, an unexpected external force (stress) is applied to the sensor chip, thereby reducing detection accuracy of the sensor chip.

In this manner, the vibrating device of Patent Document 1 has a problem that it is impossible to achieve miniaturization while preventing a reduction in characteristics.

SUMMARY

An advantage of some aspects of the invention is to provide a vibrating device which can achieve miniaturization while preventing a reduction in characteristics of a vibrating element due to strain, and an electronic apparatus.

Application Example 1

This application example of the invention is directed to a vibrating device including: a package having an accommodating space in the interior thereof; and a vibrating element and an IC chip accommodated in the accommodating space, wherein the package has a bottom portion having an IC chip mounting area and a vibrating element mounting area, the IC chip mounting area including an IC chip mounting surface on which the IC chip is mounted, the vibrating element mounting area being disposed in parallel with the IC chip mounting area and including a vibrating element mounting surface on which the vibrating element is mounted, the thickness of the bottom portion is smaller in the IC chip mounting area than in the vibrating element mounting area, and the IC chip mounting surface is located closer to a rear surface side of the bottom portion than the vibrating element mounting surface, the rear surface side being with respect to the mounting surfaces of the IC chip and the vibrating element.

With this configuration, it is possible to provide a vibrating device which can achieve miniaturization (reduction in profile) while preventing a reduction in characteristics of a vibrating element due to strain.

Application Example 2

In the vibrating device according to the above application example of the invention, it is preferable that the thickness of the vibrating element is smaller than that of the IC chip.

With this configuration, the vibrating device can be further miniaturized (reduced in profile).

Application Example 3

In the vibrating device according to the above application example of the invention, it is preferable that the vibrating element is supported at both sides thereof on the vibrating element mounting surface.

With this configuration, the held state and vibration characteristics of the vibrating element are stabilized.

Application Example 4

In the vibrating device according to the above application example of the invention, it is preferable that the bottom portion has a recess which is opened in the vibrating element mounting surface and prevents contact with the vibrating element.

With this configuration, it is possible to effectively prevent or suppress breakage and damage of the vibrating element caused by contact between the vibrating element mounting surface and the vibrating element due to an impact such as dropping.

Application Example 5

In the vibrating device according to the above application example of the invention, it is preferable that the vibrating element has a vibrating portion which vibrates, and that the vibrating element mounting surface includes, in the planar view of the bottom portion, a recess which includes in the interior thereof at least one portion of the vibrating portion.

With this configuration, the recess can be efficiently formed, and a reduction in rigidity of the vibrating element mounting area can be prevented or suppressed.

Application Example 6

In the vibrating device according to the above application example of the invention, it is preferable that the bottom portion has a regulating portion which regulates displacement of the vibrating element toward the thickness direction.

With this configuration, excessive deformation of the vibrating element can be prevented, so that breakage and damage of the vibrating element can be prevented or suppressed.

Application Example 7

In the vibrating device according to the above application example of the invention, it is preferable that at least one portion of the regulating portion faces a base portion of the vibrating element.

With this configuration, excessive deformation of the vibrating element can be prevented, and also influence on vibration characteristics can be reduced.

Application Example 8

In the vibrating device according to the above application example of the invention, it is preferable that the vibrating device further includes a buffer layer disposed between the vibrating element mounting surface and the vibrating element.

With this configuration, when the vibrating element is greatly displaced due to excessive deformation in the thickness direction, the vibrating element is brought into contact with the buffer layer and the impact is absorbed and relieved. Therefore, breakage and damage of the vibrating element can be prevented or suppressed.

Application Example 9

In the vibrating device according to the above application example of the invention, it is preferable that a through-hole which communicates between the interior and exterior of the accommodating space is disposed in the bottom portion, and that the through-hole is disposed, in the planar view of the bottom portion, on the side opposite to the vibrating element via the IC chip.

With this configuration, it is possible to more reliably prevent or suppress a change in characteristics of the vibrating element due to strain.

Application Example 10

In the vibrating device according to the above application example of the invention, it is preferable that the through-hole is disposed in a thicker area of the bottom portion than the IC chip mounting area.

With this configuration, it is possible to more reliably prevent or suppress a change in characteristics of the vibrating element due to strain.

Application Example 11

In the vibrating device according to the above application example of the invention, it is preferable that the vibrating element is a gyro element which detects an angular velocity.

With this configuration, it is possible to obtain a vibrating device which can detect an angular velocity.

Application Example 12

This application example of the invention is directed to an electronic apparatus including the vibrating device according to the above application example of the invention.

With this configuration, an electronic apparatus with high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrating device and an electronic apparatus according to the invention will be described in detail based on embodiments shown in the accompanying drawings.

First Embodiment

First, a first embodiment of a vibrating device according to the invention will be described.

Figure 1:
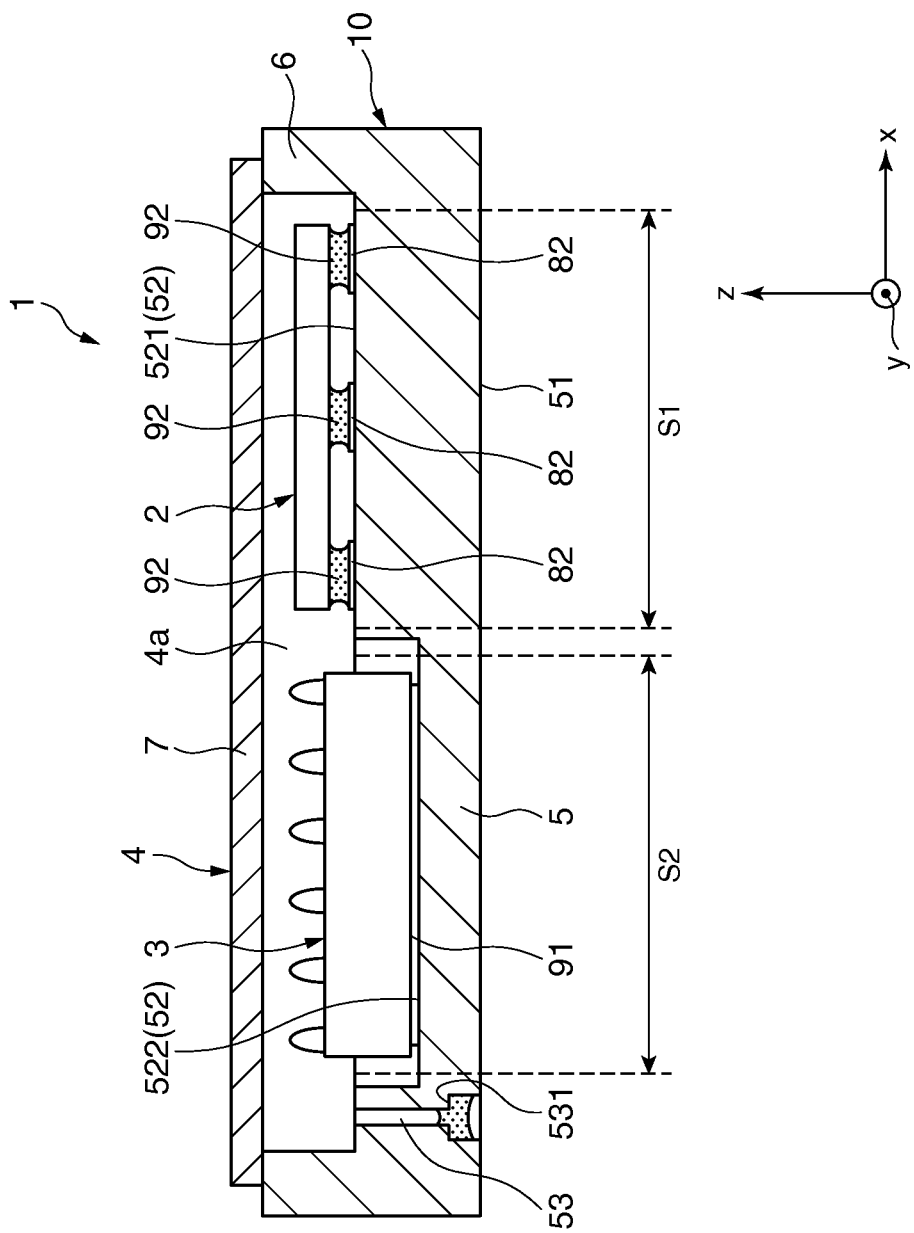
FIG. 1 is a cross-sectional view showing a first embodiment of a vibrating device according to the invention.
Figure 2A:
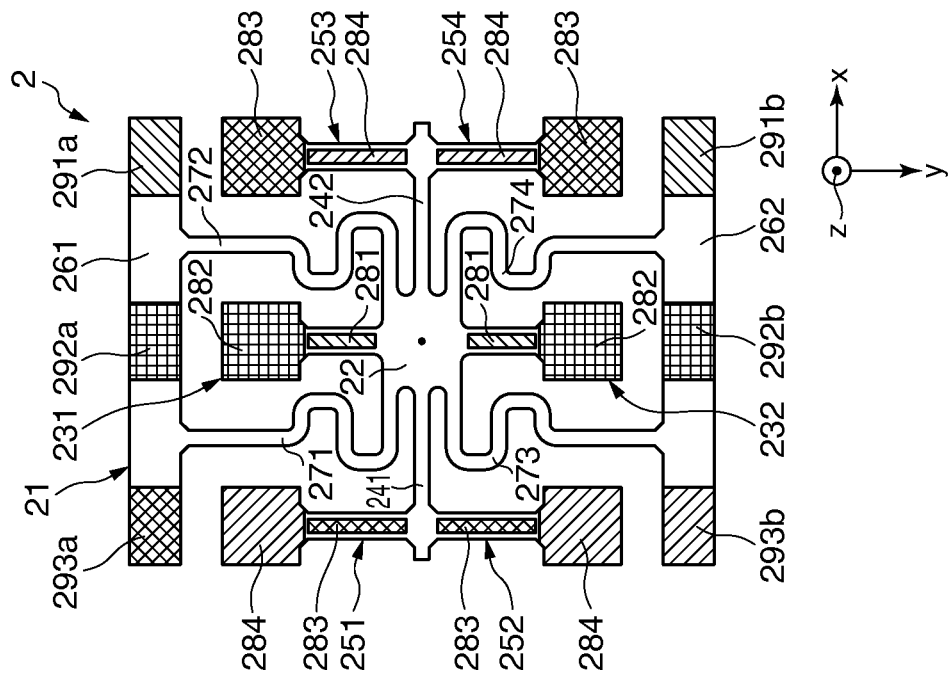
FIGS. 2A and 2B are plan views of a gyro element included in the vibrating device shown in FIG. 1.
Figure 2B:
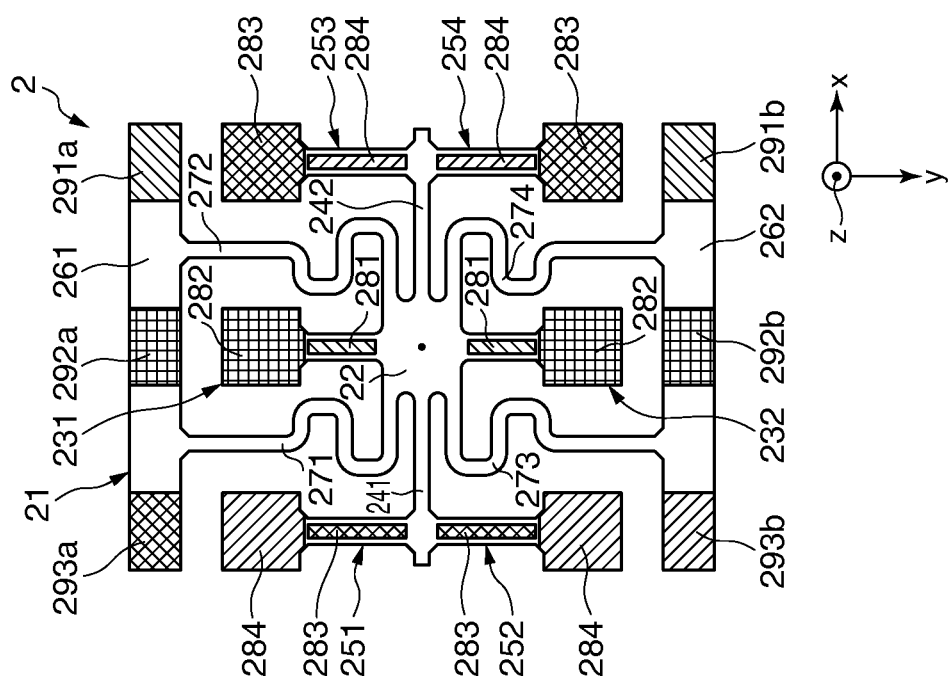
Figure 3A:
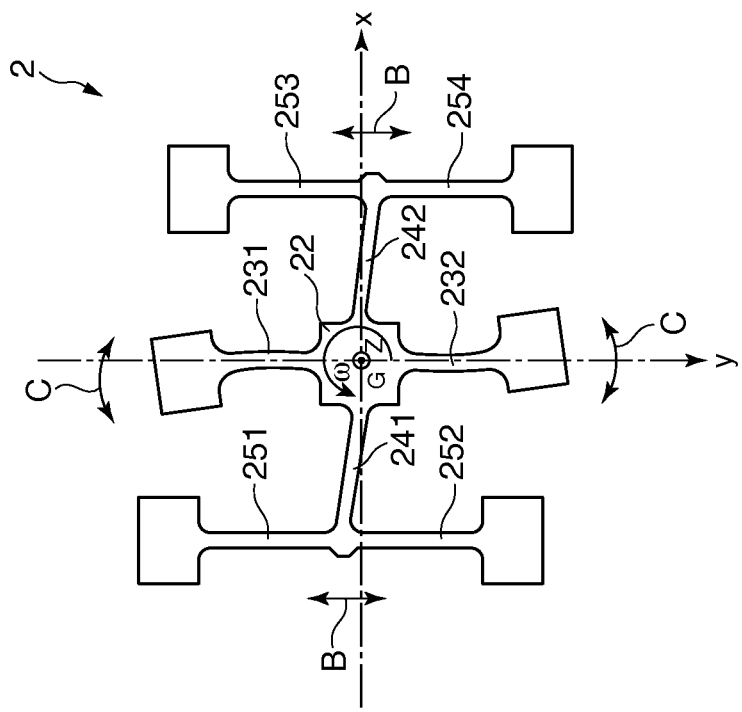
FIGS. 3A and 3B are plan views explaining the driving of the gyro element shown in FIGS. 2A and 2B.
Figure 3B:
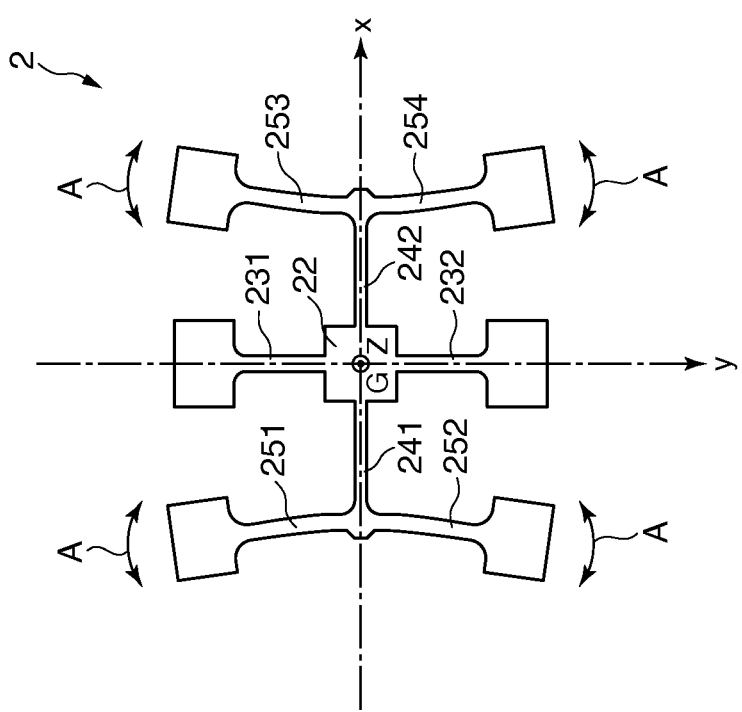
Figure 4:
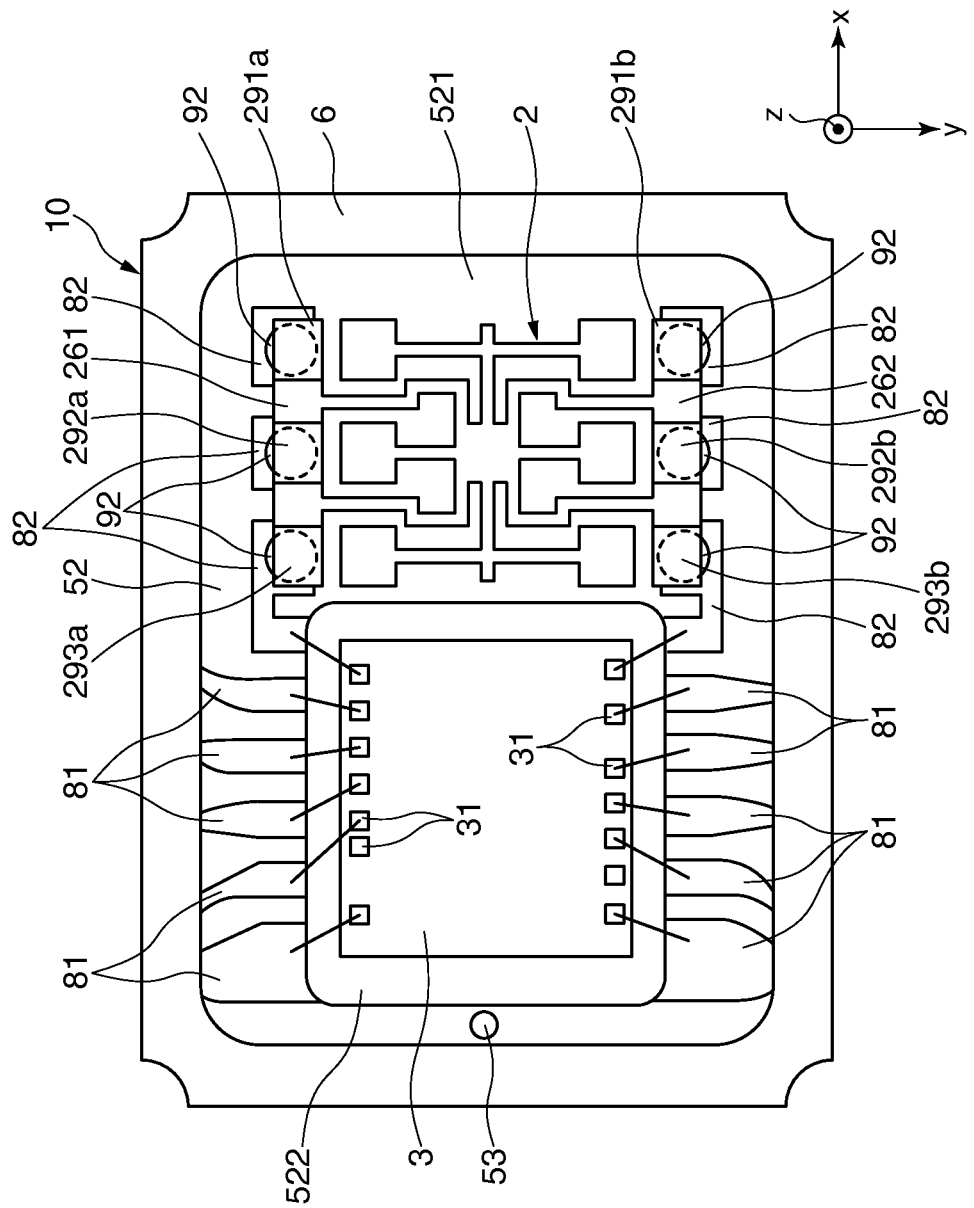
FIG. 4 is a plan view of the vibrating device shown in FIG. 1.
Figure 5:
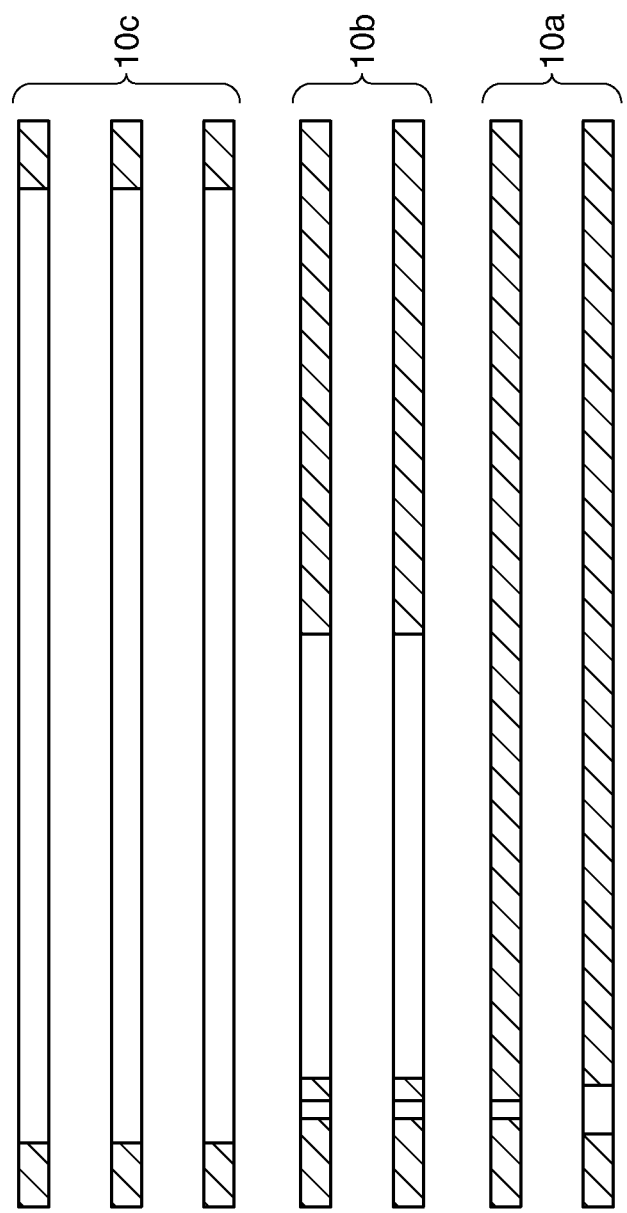
FIG. 5 is a cross-sectional view showing one example of a manufacturing method of a base of the vibrating device shown in FIG. 1.

FIG. 1 is a cross-sectional view showing the first embodiment of the vibrating device according to the invention. FIGS. 2A and 2B are plan views of a gyro element included in the vibrating device shown in FIG. 1. FIGS. 3A and 3B are plan views explaining the driving of the gyro element shown in FIGS. 2A and 2B. FIG. 4 is a plan view of the vibrating device shown in FIG. 1. FIG. 5 is a cross-sectional view showing one example of a manufacturing method of a base of the vibrating device shown in FIG. 1.

In the following, the upper side in FIG. 1 is referred to as "upper", the lower side is referred to as "lower", the right side is referred to as "right", and the left side is referred to as "left", for convenience of description. Moreover, as shown in FIG. 1, three axes perpendicular to each other are referred to as x-axis, y-axis, and z-axis. The z-axis coincides with the thickness direction of the vibrating device. Moreover, a direction parallel to the x-axis is referred to as "x-axis direction", a direction parallel to the y-axis is referred to as "y-axis direction", and a direction parallel to the z-axis is referred to as "z-axis direction".

The vibrating device 1 shown in FIG. 1 has a gyro element (vibrating element) 2, an IC chip 3 which controls the driving or the like of the gyro element 2, and a package 4 which accommodates the gyro element 2 and the IC chip 3.

Although a gyro element is used as a vibrating element in the vibrating device 1 of the embodiment, a vibrating element to be used is not limited to a gyro element. For example, an acceleration sensor, an AT vibrator (oscillator), or the like may be used.

Hereinafter, these will be sequentially described in detail.

Gyro Element 2

Hereinafter, the gyro element 2 will be described based on FIGS. 2A and 2B and FIGS. 3A and 3B. Here, FIG. 2A is a plan view of an upper surface seen from above (a lid 7 side), and FIG. 2B is a plan view (perspective view) of a lower surface seen from above. In FIGS. 2A and 2B, electrodes and terminals are hatched for convenience of description. In FIGS. 3A and 3B, illustrations of supporting portions, beams, electrodes, and the like are omitted for convenience of description.

The gyro element 2 is a so-called "in-plane detection-type" sensor which detects an angular velocity about the z-axis. As shown in FIGS. 2A and 2B, the gyro element 2 is composed of a vibrating reed 21, and a plurality of electrodes, wirings, and terminals formed on the surfaces of the vibrating reed 21.

The vibrating reed 21 is of a so-called double-T-type. The vibrating reed 21 can be composed of a piezoelectric material such as quartz crystal, lithium tantalate, or lithium niobate. However, quartz crystal is preferable among them. With this configuration, the vibrating reed 21 which can provide excellent vibration characteristics (frequency characteristics) is obtained.

The vibrating reed 21 extends in the xy plane and has its thickness in the z-axis direction. The vibrating reed 21 has a base portion 22 located at the center, a pair of detecting vibration arms 231 and 232 each extending outwardly from the base portion 22 in the y-axis direction, a pair of coupling arms 241 and 242 each extending outwardly from the base portion 22 in the x-axis direction, a pair of driving vibration arms 251 and 252 each extending outwardly from a tip portion of the coupling arm 241 in the y-axis direction, and a pair of driving vibration arms 253 and 254 each extending outwardly from a tip portion of the coupling arm 242 in the y-axis direction. Moreover, the vibrating reed 21 has a pair of supporting portions 261 and 262 arranged to face each other via the base portion 22 in the y-axis direction and four beams 271, 272, 273, and 274 coupling the supporting portions 261 and 262 with the base portion 22.

At a tip portion of each of the detecting vibration arms 231 and 232 and the driving vibration arms 251 to 254, a weight portion which is substantially quadrilateral and has a width greater than that thereof on its base-end side is formed. By disposing the weight portion, detection sensitivity of the gyro element 2 for angular velocity is improved.

The supporting portions 261 and 262 each extend in the x-axis direction. The other portions constituting the vibrating reed 21 are located between these supporting portions 261 and 262. The supporting portion 261 is coupled with the base portion 22 via the beams 271 and 272. The supporting portion 262 is coupled with the base portion 22 via the beams 273 and 274.

The beam 271 passes through between the detecting vibration arm 231 and the driving vibration arm 251 to couple the supporting portion 261 with the base portion 22. The beam 272 passes through between the detecting vibration arm 231 and the driving vibration arm 253 to couple the supporting portion 261 with the base portion 22. The beam 273 passes through between the detecting vibration arm 232 and the driving vibration arm 252 to couple the supporting portion 262 with the base portion 22. The beam 274 passes through between the detecting vibration arm 232 and the driving vibration arm 254 to couple the supporting portion 262 with the base portion 22.

The beams 271, 272, 273, and 274 each have a serpentine portion (S-shaped portion) which extends in the y-axis direction while reciprocating in the x-axis direction, thereby having elasticity in the x-axis direction and the y-axis direction.

Moreover, since the beams 271, 272, 273, and 274 each have an elongated shape with the serpentine portion, the beams 271, 272, 273, and 274 have elasticity in all directions.

Therefore, even when an external impact is applied, an effect of absorbing the impact is provided by the beams 271, 272, 273, and 274. Therefore, it is possible to reduce or suppress detection noise due to the impact.

The configuration of the vibrating reed 21 has been described so far. On the surfaces of the vibrating reed 21, the plurality of electrodes, wirings, and terminals are formed.

Specifically, a detecting signal electrode 281 is formed on upper and lower surfaces of the detecting vibration arm 231. Similarly, a detecting signal electrode 281 is formed on upper and lower surfaces of the detecting vibration arm 232.

The pair of detecting signal electrodes 281 formed on the detecting vibration arm 231 are electrically connected, via wirings (not shown) formed on the surfaces of the vibrating reed 21, to detecting signal terminals 291$a$ formed on the supporting portion 261. The pair of detecting signal electrodes 281 formed on the detecting vibration arm 232 are electrically connected, via wirings (not shown) formed on the surfaces of the vibrating reed 21, to detecting signal terminals 291$b$ formed on the supporting portion 262.

Moreover, a detecting ground electrode 282 is formed on side surfaces of the detecting vibration arm 231 and upper and lower surfaces of the weight portion of the detecting vibration arm 231. Similarly, a detecting ground electrode 282 is formed also on side surfaces of the detecting vibration arm 232 and upper and lower surfaces of the weight portion of the detecting vibration arm 232.

The pair of detecting ground electrodes 282 formed on the detecting vibration arm 231 are electrically connected, via wirings (now shown) formed on the surfaces of the vibrating reed 21, to detecting ground terminals 292$a$ formed on the supporting portion 261. The pair of detecting ground electrodes 282 formed on the detecting vibration arm 232 are electrically connected, via wirings (not shown) formed on the surfaces of the vibrating reed 21, to detecting ground terminals 292$b$ formed on the supporting portion 262. The detecting ground electrode 282 has a potential serving as a ground with respect to the detecting signal electrode 281.

By forming the detecting signal electrodes 281 and the detecting ground electrodes 282 with the arrangement described above, detecting vibration generated in the detecting vibration arm 231 appears as electric charge between the detecting signal electrode 281 and the detecting ground electrode 282 formed on the detecting vibration arm 231, and can be extracted as a signal from the detecting signal terminal 291$a$ and the detecting ground terminal 292$a$ formed on the supporting portion 261. Moreover, detecting vibration generated in the detecting vibration arm 232 appears as electric charge between the detecting signal electrode 281 and the detecting ground electrode 282 formed on the detecting vibration arm 232, and can be extracted as a signal from the detecting signal terminal 291$b$ and the detecting ground terminal 292$b$ formed on the supporting portion 262.

Moreover, a driving signal electrode 283 is formed on upper and lower surfaces of the driving vibration arm 251. Similarly, a driving signal electrode 283 is formed also on upper and lower surfaces of the driving vibration arm 252. Moreover, a driving signal electrode 283 is formed also on side surfaces of the driving vibration arm 253 and upper and lower surfaces of the weight portion of the driving vibration arm 253. Similarly, a driving signal electrode 283 is formed also on side surfaces of the driving vibration arm 254 and upper and lower surfaces of the weight portion of the driving vibration arm 254. These plurality of driving signal electrodes 283 are electrically connected, via wirings (not shown) formed on the surfaces of the vibrating reed 21, to driving signal terminals 293a formed on the supporting portion 261.

Moreover, a driving ground electrode 284 is formed on side surfaces of the driving vibration arm 251 and upper and lower surfaces of the weight portion of the driving vibration arm 251. Similarly, a driving ground electrode 284 is formed also on side surfaces of the driving vibration arm 252 and upper and lower surfaces of the weight portion of the driving vibration arm 252. Moreover, a driving ground electrode 284 is formed also on upper and lower surfaces of the driving vibration arm 253. Similarly, a driving ground electrode 284 is formed also on upper and lower surfaces of the driving vibration arm 254. These plurality of driving ground electrodes 284 are electrically connected, via wirings (not shown) formed on the surfaces of the vibrating reed 21, to driving ground terminals 293b formed on the supporting portion 262. The driving ground electrode 284 has a potential serving as a ground with respect to the driving signal electrode 283.

When the driving signal electrodes 283 and the driving ground electrodes 284 are formed with the arrangement described above, an electric field is generated between the driving signal electrode 283 and the driving ground electrode 284 formed on each of the driving vibration arms 251, 252, 253, and 254 by applying a driving signal between the driving signal terminal 293a and the driving ground terminal 293b, thereby making it possible to drive and vibrate each of the driving vibration arms 251, 252, 253, and 254.

For these electrodes, terminals, and wirings, for example, one obtained by applying gold plating to an under layer formed on the surfaces of the vibrating reed 21 and composed of chromium can be used. With this configuration, adhesion between the electrodes or the like and the vibrating reed 21 is improved, so that the reliability of the gyro element 2 is improved.

The gyro element 2 having the configuration described above detects an angular velocity ω about the z-axis as follows. In the gyro element 2, when an electric field is generated between the driving signal electrode 283 and the driving ground electrode 284 in a state where the angular velocity ω is not applied, the driving vibration arms 251, 252, 253, and 254 perform bending vibration in directions shown by double-headed arrows A as shown in FIG. 3A. In this case, since the driving vibration arms 251 and 252 and the driving vibration arms 253 and 254 vibrate plane-symmetrically with respect to the yz plane passing through a central point G (center of gravity G), the base portion 22, the coupling arms 241 and 242, and the detecting vibration arms 231 and 232 hardly vibrate.

When the angular velocity Ct) about the z-axis is applied to the gyro element 2 in a state of performing this driving vibration, the gyro element 2 vibrates as shown in FIG. 3B. That is, the Coriolis force in directions of double-headed arrows B acts on the driving vibration arms 251, 252, 253, and 254 and the coupling arms 241 and 242, and in response to vibration in the directions of the double-headed arrows B, detecting vibration in directions of double-headed arrows C is excited. Then, the strain of the detecting vibration arms 231 and 232 caused by this vibration is detected by the detecting signal electrode 281 and the detecting ground electrode 282 to obtain the angular velocity ω.

IC Chip

The IC chip 3 is an electron device formed by integrating a driving circuit (oscillator circuit) which drives (oscillates) the gyro element 2, a detector circuit including a charge amplifier, and the like. That is, the IC chip 3 is an electron device which outputs an electric signal to the driving signal electrode 283 of the gyro element 2 and receives and processes an electric signal from the detecting signal electrode 281 to obtain the angular velocity ω about the z-axis.

Package

The package 4 accommodates the gyro element 2 and the IC chip. The package 4 has, in the planar view thereof (the xy-plane view), substantially a rectangular shape extending in the x-axis direction, and accommodates the gyro element 2 and the IC chip 3 in a state where they are arranged side by side in the x-axis direction.

As shown in FIG. 1, the package 4 has a base 10 having a recess opened in its upper surface and the lid 7 bonded to the base so as to cover the opening of the recess. The base 10 has a plate-like bottom plate (bottom portion) 5 and a frame-like side wall 6 disposed at a peripheral edge portion of an upper surface of the bottom plate 5. The package 4 has an accommodating space 4a in the interior thereof. Within the accommodating space 4a, the gyro element 2 and the IC chip 3 are airtightly accommodated and mounted.

As shown in FIG. 1, the bottom plate 5 has a flat lower surface 51 and an upper surface 52 having a step. The upper surface 52 has a gyro element mounting surface (vibrating element mounting surface) 521 which is located at an upper stage portion of the step and on which the gyro element 2 is mounted, and an IC chip mounting surface 522 which is located at a lower stage portion of the step and on which the IC chip 3 is mounted.

The IC chip 3 is mounted on and fixed to the IC chip mounting surface 522 via conductive adhesive 91 such as silver paste. With this configuration, a lower surface of the IC chip 3 can be grounded, which stabilizes a reference potential.

As shown in FIG. 4, a plurality of IC pads 31 are formed on an upper surface of the IC chip 3. On the other hand, a connection pad 81 corresponding to each of the IC pads 31 is formed at the upper stage portion (the periphery of the IC chip 3) of the upper surface 52 of the bottom plate 5. The connection pad 81 and the IC pad 31 are electrically connected via a wire (bonding wire). Moreover, each of the connection pads 81 is electrically connected, via a conductive post (not shown) or the like formed in the bottom plate 5, to an external mount terminal (not shown) formed on the lower surface 51 of the bottom plate 5. With this configuration, electrical connection from the outside of the package 4 to the IC ship 3 can be achieved.

For each of the connection pads 81, for example, one obtained by applying gold plating to an under layer formed on the upper surface 52 of the bottom plate 5 and composed of chromium can be used. With this configuration, adhesion between the connection pad 81 and the bottom plate 5 is improved, so that the reliability of the vibrating device 1 is improved. The configuration described above is similarly applied to a connection pad 82 described later.

As shown in FIG. 1, it is preferable that the upper surface of the IC chip 3 is located lower than an upper surface of the gyro element 2. With this configuration, a space for arranging bonding wires between the IC chip 3 and the lid 7 can be sufficiently assured while achieving a reduction in profile of the vibrating device 1. Therefore, for example, contact between the lid 7 and bonding wires is easily prevented, and an electrical connection state between the IC pad 31 and the connection pad 81 can be maintained more reliably, so that the reliability of the vibrating device 1 is improved.

The location of the upper surface of the IC chip is not limited to that. For example, the upper surface of the IC chip may coincide with the upper surface of the gyro element 2, or may be located higher than the upper surface of the gyro element 2.

In the gyro element 2, each of the supporting portions 261 and 262 is mounted on and fixed to the gyro element mounting surface 521 via conductive fixing members (conductive adhesive) 92 such as solder. The supporting portions 261 and 262 are located at both ends of the gyro element 2 in the y-axis direction. Therefore, by fixing the supporting portions to the bottom plate 5, the gyro element 2 is supported at the both sides thereof on the bottom plate 5. Therefore, the gyro element 2 can be stably mounted on the bottom plate 5, and unwanted vibrations (vibrations other than vibration desired to be detected) of the gyro element 2 are suppressed, so that the detection accuracy of the gyro element 2 for angular velocity is improved.

Six conductive fixing members 92 are disposed corresponding to (in contact with) the detecting signal terminals 291a and 291b, the detecting ground terminals 292a and 292b, the driving signal terminal 293a, and the driving ground terminal 293b which are formed on the supporting portions 261 and 262, and separated from each other. On the gyro element mounting surface 521, six connection pads 82 corresponding to the detecting signal terminals 291a and 291b, the detecting ground terminals 292a and 292b, the driving signal terminal 293a, and the driving ground terminal 293b are formed. Each of the connection pads 82 and any of the terminals corresponding thereto are electrically connected via the conductive fixing member 92. Moreover, the connection pads 82 are electrically connected to the IC ship 3 via wirings (not shown) formed on the upper surface of the bottom plate 5 or in the interior thereof for example.

With this configuration described above, since the conductive fixing member 92 can be used as a fixing member for fixing the gyro element 2 to the bottom plate 5 and as a connecting member for performing electrical connection with the gyro element 2, the configuration of the vibrating device 1 can be simplified.

Moreover, the conductive fixing members 92 form a gap between the gyro element 2 and the bottom plate 5, and are each used as a gap member which prevents contact between the gyro element 2 and the bottom plate 5. With this configuration, breakage and damage of the gyro element 2 due to contact with the bottom plate 5 can be prevented, so that the vibrating device 1 which can detect an angular velocity accurately and provide excellent reliability is provided. The gap is preferably short unless it hinders the driving of the gyro element 2. With this configuration, excessive deformation of the gyro element 2 (the vibrating reed 21) due to contact of the gyro element 2 with the bottom plate 5 is prevented when an impact in the z-axis direction is applied to the vibrating device 1, so that breakage and damage of the gyro element 2 can be effectively suppressed.

As described above, the upper surface 52 of the bottom plate 5 has the gyro element mounting surface 521 on which the gyro element 2 is mounted and the IC chip mounting surface 522 which is located lower (bottom side) than the gyro element mounting surface 521 and on which the IC chip 3 is mounted.

In the vibrating device 1, the thickness (length in the z-axis direction) of the IC chip 3 is greater than that of the gyro element 2 with recent miniaturization of the gyro element 2. For example, whereas the thickness of the gyro element 2 is about 100 μm, the thickness of the IC chip 3 is about 200 μm. Therefore, the IC chip mounting surface 522 is located lower than the gyro element mounting surface 521, and the IC chip 3 is mounted on the IC chip mounting surface 522, whereby a reduction in profile of the vibrating device 1 can be achieved, and the vibrating device 1 can be miniaturized.

Moreover, as shown in FIG. 1, the bottom plate 5 has a gyro element mounting area (vibrating element mounting area) S1 including the gyro element mounting surface 521 and an IC chip mounting area S2 including the IC chip mounting surface 522. The gyro element mounting area S1 is configured such that the thickness thereof is greater than that of the IC chip mounting area S2. By mounting the gyro element 2 in the gyro element mounting area S1 which is a portion having the thickness described above, a reduction in detection accuracy of the gyro element 2 can be prevented or suppressed.

Specifically, the application of strain to the vibrating reed 21 affects vibration characteristics, which may reduce detection accuracy for angular velocity. Typical causes of the application of strain to the vibrating reed 21 includes, for example, deformation of the package 4 due to the application of an external force and deformation of the package 4 due to thermal expansion or thermal shrinkage (thermal stress).

When the package 4 is deformed due to an external force or thermal stress, the relative positional relation (separate distance) among the six conductive fixing members 92 which fix the gyro element 2 to the bottom plate 5 changes. Stress in response to the change is applied to the vibrating reed 21, so that the vibrating reed 21 is strained. In the case where thermal stress causes the deformation, if the coefficients of linear expansion of the bottom plate 5 and the vibrating reed 21 are equal to each other, strain is not substantially applied to the vibrating reed 21 because even when the package 4 deforms (expands or shrinks), the vibrating reed 21 also deforms to the same degree as the deformation of the package 4. However, since the coefficients of linear expansion of the bottom plate 5 and the vibrating reed 21 are different from each other, strain is applied to the vibrating reed 21, similarly to the case of an external force, also in the case where thermal stress causes the deformation.

Particularly in the vibrating device 1 of the embodiment, the gyro element 2 is supported at the both sides thereof on the bottom plate 5. Therefore, the stress (particularly stress in the y-axis direction) applied to the vibrating reed 21 cannot be released, so that strain is easily applied to the vibrating reed 21.

Therefore, in the vibrating device 1 as described above, the gyro element 2 is mounted in the gyro element mounting area S1 (on the gyro element mounting surface 521), whereby the application of strain to the vibrating reed 21 is prevented or suppressed to prevent or suppress a reduction in detection accuracy of the gyro element 2.

Since the gyro element mounting area S1 has a thickness greater than that of the other portion (the IC chip mounting area S2) of the bottom plate 5, the gyro element mounting area S1 has correspondingly higher rigidity. Therefore, compared to the other portion of the bottom plate 5, deformation due to an external force or thermal stress is unlikely to occur. Moreover, even if the deformation occurs, the degree of the deformation is small. By mounting the gyro element 2 in the gyro element mounting area S1 which is unlikely to deform as described above, the application of strain to the gyro element 2 can be prevented or suppressed. As a result, a reduction in detection accuracy of the gyro element 2 can be prevented or suppressed.

The thickness of the gyro element mounting area S1 is preferably from about 0.3 mm to 0.8 mm even though it varies depending on a constituent material. With this configuration, the deformation of the gyro element mounting area S1 can be more effectively prevented or suppressed while achieving a reduction in profile of the vibrating device 1.

In the bottom plate 5, a through-hole 53 as a sealing hole is formed. The through-hole 53 is a hole for causing the interior of the accommodating space 4a to be a reduced-pressure environment (preferably a vacuum). By causing the interior of the accommodating space 4a to be a reduced-pressure environment, an increase in CI value of the vibrating reed 21 due to the viscosity of air can be prevented or suppressed.

A method of reducing the pressure in the interior of the accommodating space 4a is not particularly limited, and includes, for example, a method of first removing air in the interior of the accommodating space 4a via the through-hole 53, placing a metal ball in the through-hole 53, irradiating the metal ball with a laser beam to melt the metal ball, and then covering to seal the through-hole 53. A step portion 531 which blocks the passing of the metal ball is formed in the through-hole 53, thereby making it easy to melt the metal ball within the through-hole. Specifically, the step portion 531 is formed at the boundary between a portion formed on the lower surface 51 side and having an inside diameter greater than the outside diameter of the metal ball and a portion formed on the upper surface 52 side and having an inside diameter smaller than the outside diameter of the metal ball.

As shown in FIGS. 1 and 4, the through-hole 53 is formed, in the xy-plane view, on the side opposite to the gyro element 2 via the IC chip 3. That is, the through-hole 53 is formed at a location as far as possible from the gyro element 2. Moreover, the through-hole 53 is formed at a thick portion of the bottom plate 5, in other words, at a portion other than the IC chip mounting area S2 and having a thickness greater than that of the IC chip mounting area S2. In the embodiment, the through-hole 53 is formed at a portion having the same thickness as that of the gyro element mounting area S1. By forming the through-hole 53 at the location described above, the following effects can be obtained.

As described above, the through-hole 53 is covered by melting the metal ball by laser irradiation. Therefore, as described above, the through-hole 53 is formed at a location as far as possible from the gyro element 2, whereby deformation, degradation, or the like of the gyro element 2 due to heat in laser irradiation can be prevented.

Moreover, the temperature at the periphery of the through-hole 53 is raised due to heat in laser irradiation, causing thermal expansion of the periphery of the through-hole 53. Due to the occurrence of the thermal expansion, stress may remain at the periphery of the through-hole 53 in the bottom plate 5 after sealing. Therefore, the through-hole 53 is formed at a location as far as possible from the gyro element 2, whereby it is possible to prevent or suppress a change in vibration characteristics of the vibrating reed 21 due to the stress (strain) remaining at the periphery of the through-hole 53, so that a change in detection characteristics of the gyro element 2 can be prevented or suppressed. Moreover, it is possible to prevent or suppress a change in vibration characteristics of the vibrating reed 21 also due to a temporal change in residual stress.

In the embodiment as described above, since the through-hole 53 is formed at a thick portion with high rigidity, deformation itself due to the residual stress at the peripheral portion of the through-hole 53 can be effectively prevented or suppressed. Therefore, it is possible to more reliably prevent or suppress the occurrence of the problems described above. Moreover, a crack is likely to occur from the through-hole 53 due to heat generated by excess current occurring when the lid 7 is seam-welded to the base 10 as will be described later. However, by forming the through-hole 53 at a thick portion with high rigidity, the occurrence of the crack can be effectively prevented or suppressed.

The arrangement of the through-hole 53 is not limited to that. For example, the through-hole 53 may be formed, in the xy-plane view, on the side opposite to the gyro element 2 via the IC chip 3, in the bottom plate 5 having the same thickness as that of the IC chip mounting surface 522. Even with the mode described above, it is possible to prevent or suppress a change in vibration characteristics of the vibrating reed 21 due to the stress (strain) remaining at the periphery of the through-hole 53, so that a change in detection characteristics of the gyro element 2 can be prevented or suppressed.

The constituent material of the base 10 is not particularly limited, and various kinds of ceramics such as aluminum oxide can be used. When the base 10 having the mode described above is manufactured from the constituent material described above, a laminated body is formed by laminating, as shown in FIG. 5, at least one flat plate-like substrate 10a corresponding to the shape of the bottom plate 5 in the planar view, at least one frame-like substrate 10b corresponding to the shape of the upper stage portion of the bottom plate 5 in the planar view, and at least one flat plate-like substrate 10c corresponding to the shape of the side wall 6 in the planar view, and the laminated body is baked. With this configuration, the base 10 can be manufactured simply.

The constituent material of the lid 7 is not particularly limited. However, it is desirable that the constituent material is a member having a coefficient of linear expansion close to that of the constituent material of the base 10. For example, when ceramics is used as the constituent material of the base 10 as described above, an alloy such as Kovar is preferably used. The bonding between the base 10 and the lid 7 is not particularly limited. For example, they may be bonded together via adhesive, or may be bonded by seam welding or the like.

The vibrating device 1 of the embodiment has been described so far. According to the vibrating device, miniaturization (reduction in profile) of the device can be achieved while preventing or suppressing a reduction in detection characteristics for angular velocity by reducing the influence of strain as described above. Particularly, since it is possible to prevent or suppress a change in vibration characteristics of the vibrating reed 21 due to strain, it is possible, for example, to eliminate or reduce the difference between vibration characteristics in shipping inspection and vibration characteristics in mounting on a circuit board or the like. Therefore, excellent detection accuracy can be provided also in mounting. Moreover, electrical characteristics are stabilized, so that detection with higher accuracy can be performed.

Second Embodiment

Next, a second embodiment of a vibrating device according to the invention will be described.

Figure 6:
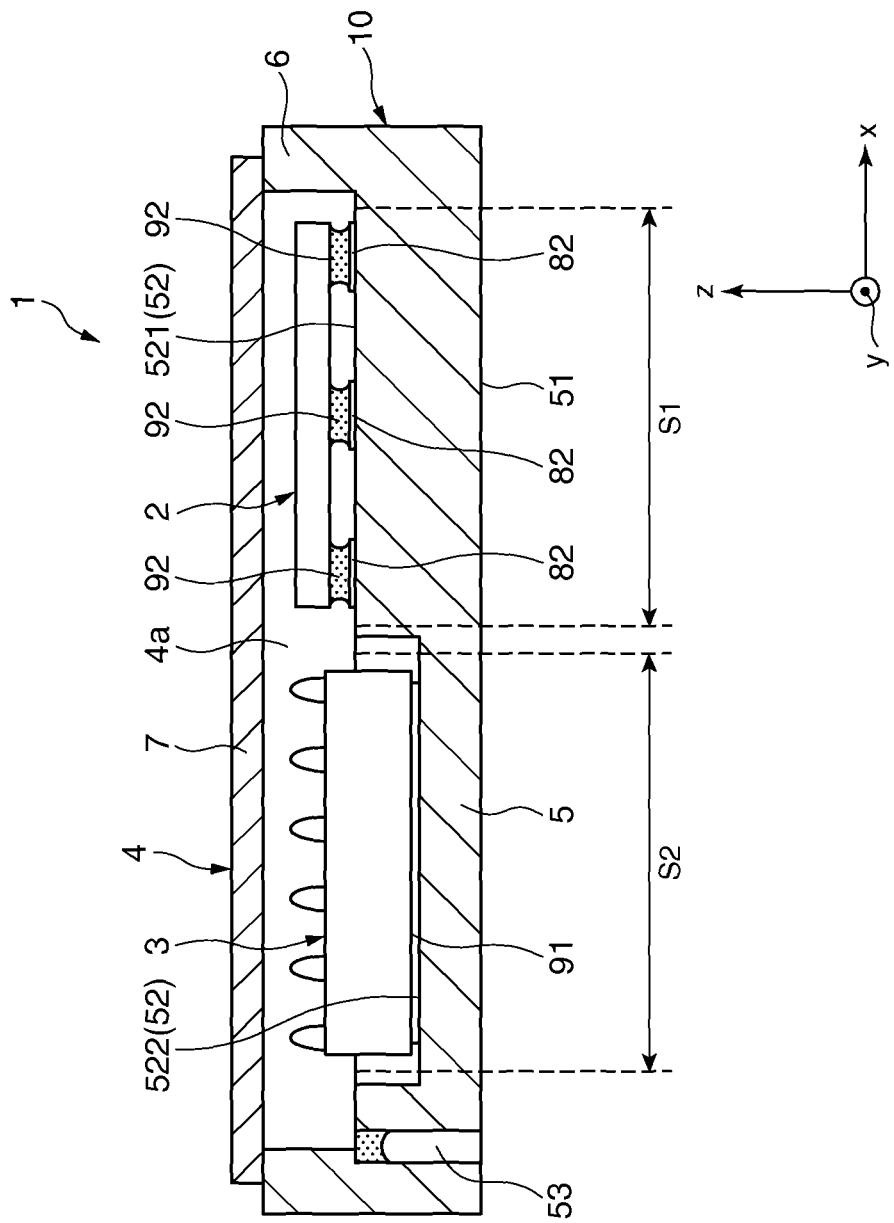
FIG. 6 is a cross-sectional view of a vibrating device according to a second embodiment of the invention.

FIG. 6 is a cross-sectional view of the vibrating device according to the second embodiment of the invention.

Hereinafter, the vibrating device of the second embodiment will be described mainly on the differences from the above-described embodiment. Descriptions of matters similar to those of the above-described embodiment are omitted.

The vibrating device according to the second embodiment of the invention is similar to that of the above-described first embodiment, excepting that the location and shape of the through-hole are different. Configurations similar to those of the above-described first embodiment are denoted by the same reference and numeral signs.

As shown in FIG. 6, in the vibrating device 1 of the embodiment, the through-hole 53 has an inside diameter substantially constant in the axial direction (z-axis direction). Moreover, a portion of the through-hole 53 overlaps with the side wall 6 in the xy-plane view. In other words, a portion of an upper opening of the through-hole 53 is covered by the side wall 6.

By configuring the through-hole 53 as described above, the shape of the through-hole 53 can be simplified compared to the first embodiment. Moreover, since the passing of the metal ball can be blocked by covering a portion of the opening with the side wall 6, the metal ball can be reliably melted within the through-hole 53. Moreover, for example, the through-hole 53 can be formed at a location more separate from the gyro element 2 compared to the first embodiment.

Also in the second embodiment, effects similar to those of the above-described first embodiment can be provided.

Third Embodiment

Next, a third embodiment of a vibrating device according to the invention will be described.

Figure 7:
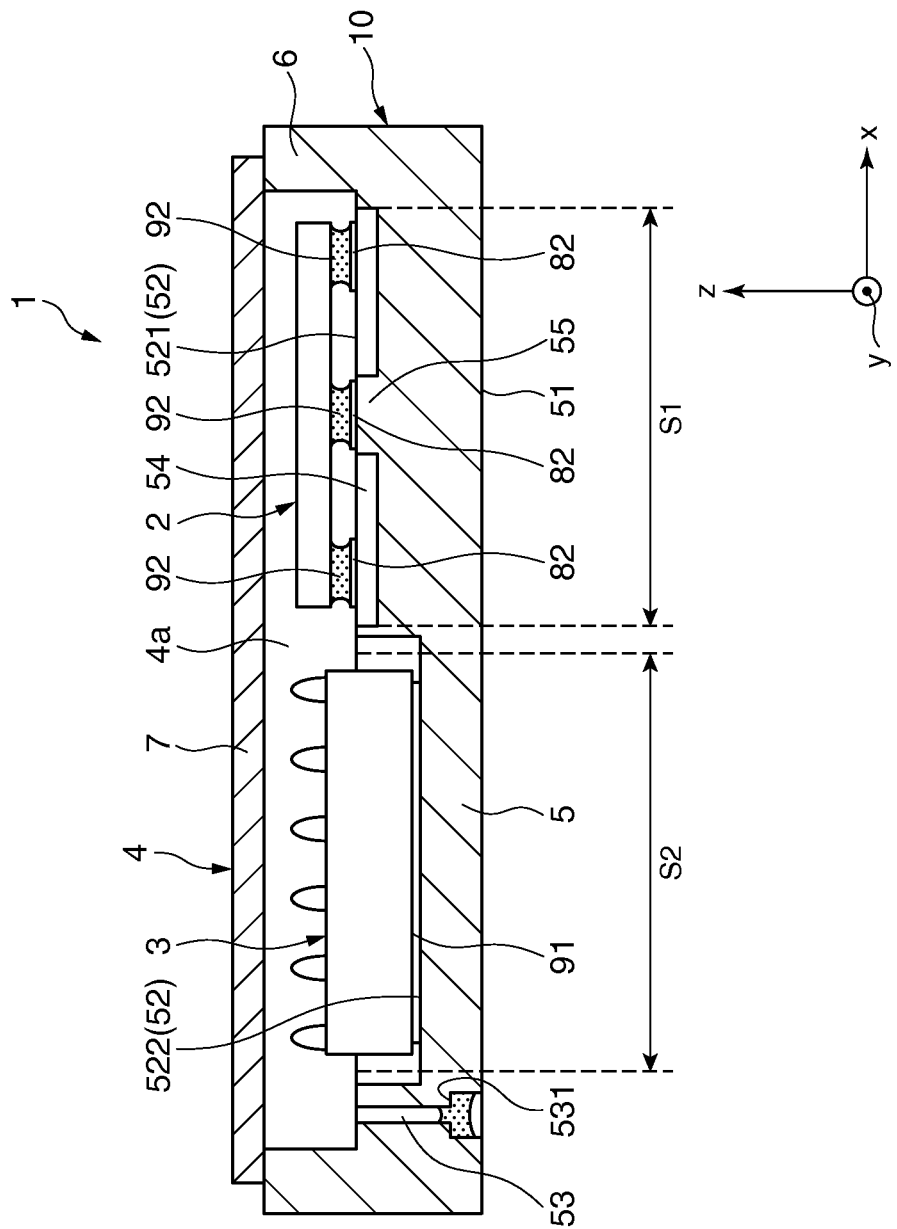
FIG. 7 is a cross-sectional view of a vibrating device according to a third embodiment of the invention.
Figure 8:
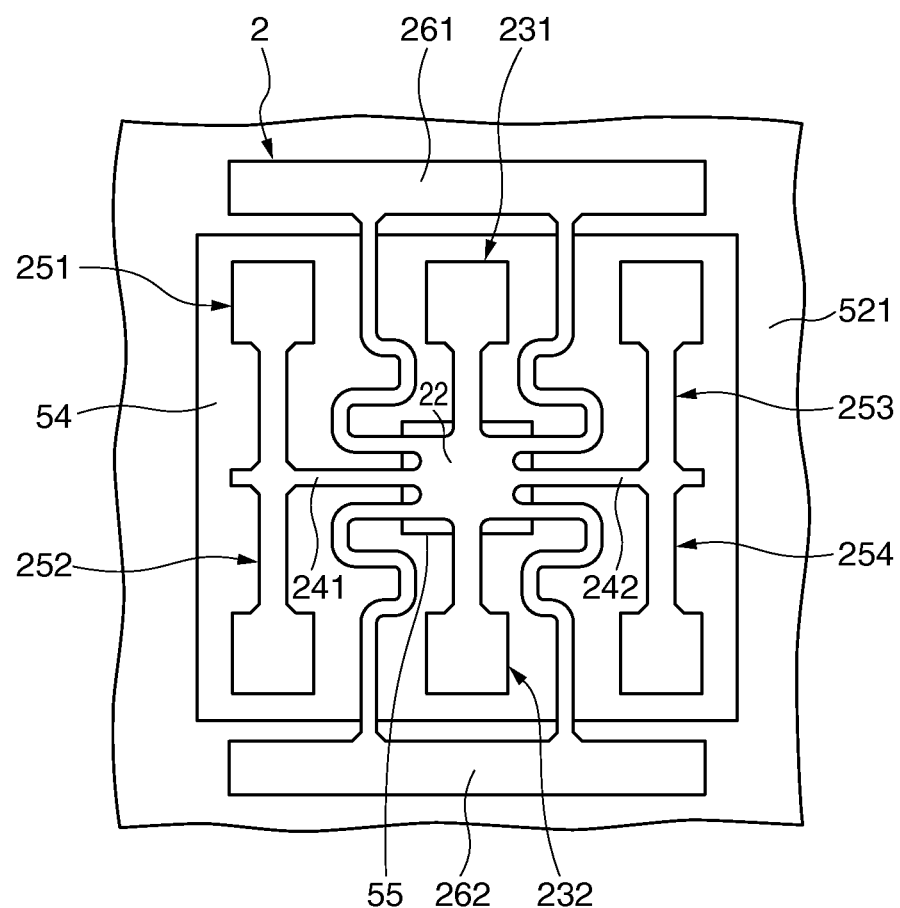
FIG. 8 is a plan view of the vibrating device shown in FIG. 7.
Figure 9:
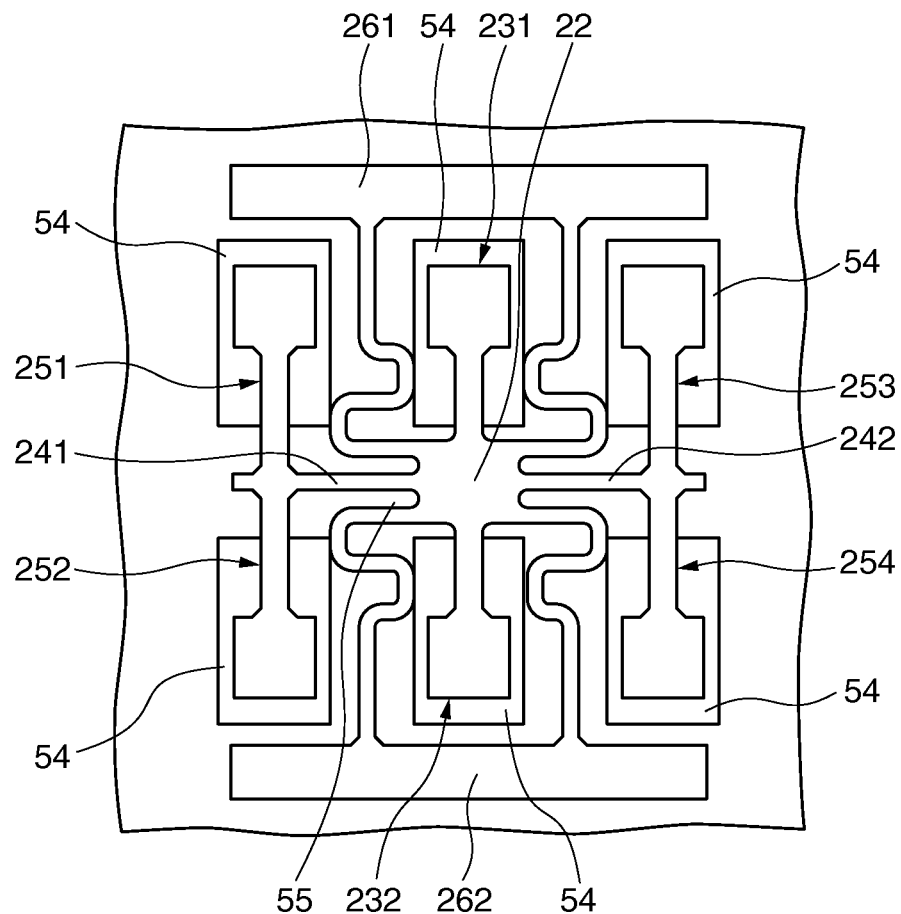
FIG. 9 is a plan view showing a modified example of a recess of the vibrating device shown in FIG. 7.

FIG. 7 is a cross-sectional view of the vibrating device according to the third embodiment of the invention. FIG. 8 is a plan view of the vibrating device shown in FIG. 7. FIG. 9 is a plan view showing a modified example of a recess of the vibrating device shown in FIG. 7.

Hereinafter, the vibrating device of the third embodiment will be described mainly on the difference from the above-described embodiment. Descriptions of matters similar to those of the above-described embodiment are omitted.

The vibrating device according to the third embodiment of the invention is similar to that of the above-described first embodiment, excepting that the configuration of the bottom plate is different. Configurations similar to those of the above-described first embodiment are denoted by the same reference and numeral signs.

As shown in FIG. 7, the bottom plate 5 has a frame-like recess 54 opened in the gyro element mounting surface 521 and a projecting portion 55 surrounded by the recess 54. The recess 54 is formed, in the xy-plane view, so as to include in the interior thereof the detecting vibration arms 231 and 232 and the driving vibration arms 251, 252, 253, and 254 of the gyro element 2.

By forming the recess 54, a relatively large gap can be formed between the bottom plate 5, and the detecting vibration arms 231 and 232 and the driving vibration arms 251, 252, 253, and 254. Therefore, an increase in CI value of the gyro element 2 (the vibrating reed 21) due to air resistance (viscosity of air) in the atmosphere is suppressed, so that vibration characteristics can be stabilized.

Moreover, for example, it is possible to further reduce the amount of difference between the leakage amount of signal of the gyro element 2 in tuning performed before sealing and the leakage amount of signal after sealing. Therefore, the vibrating device 1 which can provide desired characteristics (characteristics after tuning) also after sealing is obtained.

The depth (length in the z-axis direction) of the recess 54 is not particularly limited, and preferably, for example, from about 10 to 100 μm. With this configuration, the functions described above can be sufficiently provided, and a reduction in rigidity of the gyro element mounting area S1 can be suppressed.

The projecting portion (regulating portion) 55 surrounded by the recess 54 is disposed to face the base portion 22 of the gyro element 2. An upper surface of the projecting portion 55 is located on the same plane with the gyro element mounting surface 521. With the projecting portion 55, when an impact in the z-axis direction is applied to the vibrating device 1, the base portion 22 of the gyro element 2 is brought into contact with the projecting portion 55, so that excessive deformation of the gyro element 2 (the vibrating reed 21) is prevented. Therefore, breakage and damage of the gyro element 2 can be effectively prevented. Since the base portion 22 hardly vibrates even in driving, the problem of the degradation of vibration characteristics due to air resistance described above hardly occurs even when the projecting portion 55 is disposed.

The shape of the recess 54 in the planar view is not particularly limited as long as the effects described above can be provided. For example, as shown in FIG. 9, six recesses 54 may be formed such that each of the recesses corresponds to each arm (each vibrating portion) of the detecting vibration arms 231 and 232 and the driving vibration arms 251, 252, 253, and 254. With this configuration, the occupancy of the recesses 54 in the gyro element mounting area S1 can be reduced, so that a reduction in rigidity of the gyro element mounting area S1 can be more effectively prevented or suppressed. In this case, portions located between the six recesses 54 constitute the projecting portion 55.

In the embodiment, the upper surface of the projecting portion 55 is located on the same plane as the gyro element mounting surface 521. However, the upper surface of the projecting portion 55 may be located higher or lower than the gyro element mounting surface 521.

Also in the third embodiment, effects similar to those of the above-described first embodiment can be provided.

Fourth Embodiment

Next, a fourth embodiment of a vibrating device according to the invention will be described.

Figure 10:
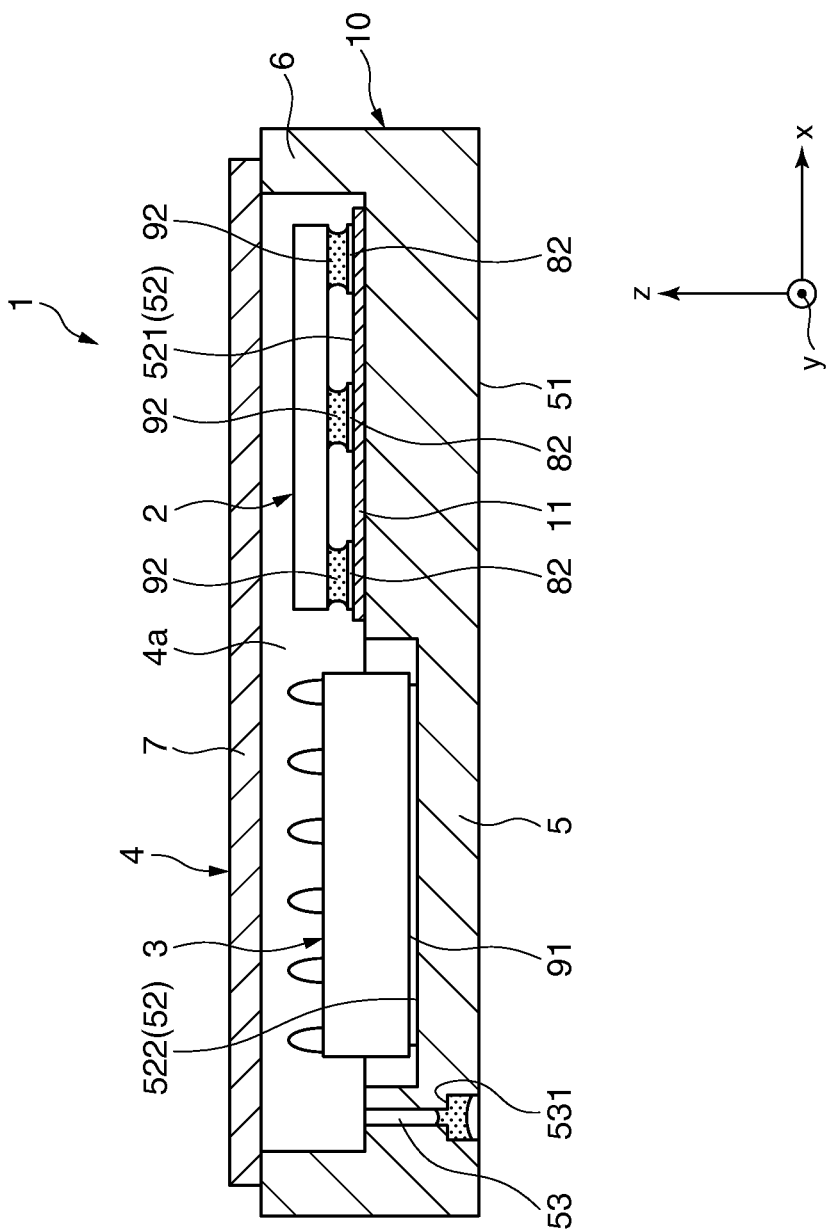
FIG. 10 is a cross-sectional view of a vibrating device according to a fourth embodiment of the invention.

FIG. 10 is a cross-sectional view of the vibrating device according to the fourth embodiment of the invention.

Hereinafter, the vibrating device of the fourth embodiment will be described mainly on the difference from the above-described embodiment. Descriptions of matters similar to those of the above-described embodiment are omitted.

The vibrating device according to the fourth embodiment of the invention is similar to that of the above-described first embodiment, excepting that a buffer layer is disposed between the bottom plate (gyro element mounting surface) and the gyro element. Configurations similar to those of the above-described first embodiment are denoted by the same reference and numeral signs.

As shown in FIG. 10, the vibrating device 1 of the embodiment has the buffer layer 11 disposed on the gyro element mounting surface 521. Then, the gyro element 2 is bonded to an upper surface of the buffer layer 11 via the conductive fixing members 92.

Moreover, the buffer layer 11 is disposed, in the xy-plane view, so as to include in the interior thereof the whole of the gyro element 2.

The buffer layer 11 absorbs and relieves stress transmitted from the bottom plate 5 to the gyro element 2, or vibration leakage from the gyro element 2, whereby the buffer layer 11 has a function of effectively preventing or suppressing the application of strain to the gyro element 2 (the vibrating reed 21) and a change in characteristics due to vibration leakage. With this configuration, the vibrating device 1 in which influence due to strain and a change in characteristics due to vibration leakage are further reduced is obtained.

It is preferable that the buffer layer 11 is composed of a material whose linear expansivity is close to that of the constituent material (quartz crystal) of the vibrating reed 21. By using the material described above, the above effects can be more remarkably provided.

Moreover, it is preferable that the constituent material of the buffer layer 11 is a material whose modulus of elasticity is from about several GPa to several tens MPa. By using the material described above, when an impact in the z-axis direction is applied to the vibrating device 1 for example, the gyro element 2 is brought into contact with the buffer layer 11 and therefore the impact is absorbed and relieved, so that breakage and damage of the gyro element 2 can be effectively prevented.

In the buffer layer 11, conductive posts (not shown) are formed. Via the conductive post, the conductive fixing member 92 and the connection pad 82 corresponding to the conductive fixing member 92 are electrically connected.

Also in the fourth embodiment, effects similar to those of the above-described first embodiment can be provided.

Fifth Embodiment

Next, a fifth embodiment of a vibrating device according to the invention will be described.

Figure 11:
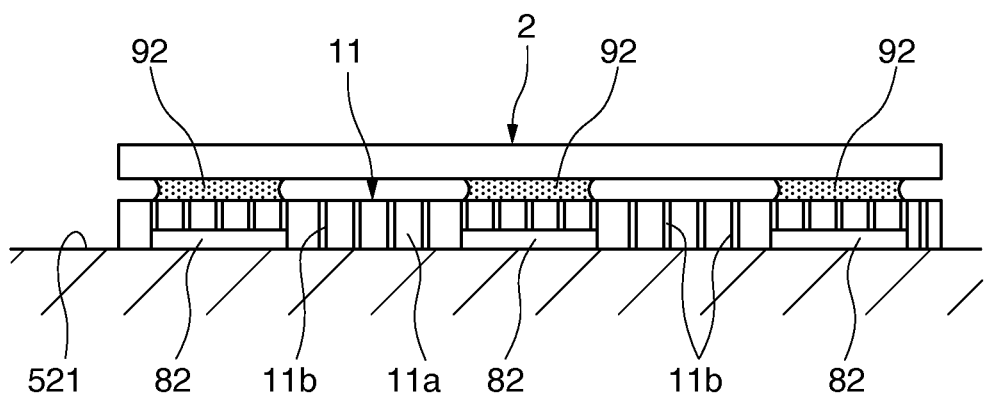
FIG. 11 is a cross-sectional view of a vibrating device according to a fifth embodiment of the invention.

FIG. 11 is a cross-sectional view of the vibrating device according to the fifth embodiment of the invention.

Hereinafter, the vibrating device of the fifth embodiment will be described mainly on the difference from the above-described embodiment. Descriptions of matters similar to those of the above-described embodiment are omitted.

The vibrating device according to the fifth embodiment of the invention is similar to that of the above-described fourth embodiment, excepting that the configuration of the buffer layer is different. Configurations similar to those of the above-described fourth embodiment are denoted by the same reference and numeral signs.

In the vibrating device 1 of the embodiment, the buffer layer 11 is composed of an anisotropically conductive film (or anisotropically conductive adhesive). The buffer layer 11 has a conductive property in the thickness direction thereof but has an insulating property in the plane direction. With this configuration, the conductive fixing member 92 located on the upper surface side of the buffer layer 11 can be electrically connected with the connection pad 82 corresponding to the conductive fixing member 92 and located on the lower surface side of the buffer layer 11 via the buffer layer 11 while preventing a short circuit between the plurality of connection pads 82. By using an anisotropically conductive film as the buffer layer 11 in this manner, it is unnecessary to form conductive posts in the buffer layer 11 unlike the above-described fourth embodiment, so that the configuration or manufacturing of the vibrating device 1 is simplified.

The configuration of the buffer layer 11 is not particularly limited, and includes, for example as shown in FIG. 11, a configuration obtained by embedding thin metal wires 11b in an insulating sheet 11a such as of silicone such that the axis line coincides with the thickness direction of the sheet.

Also in the fifth embodiment, effects similar to those of the above-described first embodiment can be provided.

The vibrating device 1 described so far can be incorporated into various kinds of electronic apparatuses. An electronic apparatus according to the invention incorporating therein the vibrating device 1 is not particularly limited, and can be applied to personal computers (for example, mobile personal computers), mobile terminals such as mobile phones, digital still cameras, inkjet discharge apparatuses (for example, inkjet printers), laptop personal computers, tablet personal computers, TV sets, video camcorders, videotape recorders, car navigation systems, pagers, electronic notebooks (including those with communication function), electronic dictionaries, calculators, electronic gaming machines, controllers for game, word processors, workstations, videophones, surveillance TV monitors, electronic binoculars, POS terminals, medical apparatuses (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), flight simulators, head-mounted displays, motion tracing, motion tracking, motion controllers, and PDR (pedestrian dead reckoning).

The vibrating device and the electronic apparatus according to the invention have been described so far based on the embodiments shown in the drawings. However, the invention is not limited to them, and the configuration of each of the portions can be replaced with any configuration having a similar function. Moreover, any another component or process may be added. Moreover, the vibrating device according to the invention may be one obtained by combining any two or more configurations (features) of the embodiments.

The entire disclosure of Japanese Patent Application No. 2011-163705, filed Jul. 26, 2011 is expressly incorporated by reference herein.

What is claimed is:

1. A vibrating device comprising:
a package having an accommodating space in the interior thereof; and
a vibrating element and an IC chip accommodated in the accommodating space, wherein
the package has a bottom portion having an IC chip mounting area and a vibrating element mounting area, the IC chip mounting area including an IC chip mounting surface on which the IC chip is mounted, the vibrating element mounting area being disposed in parallel with the IC chip mounting area and including a vibrating element mounting surface on which the vibrating element is mounted,
the thickness of the bottom portion is smaller in the IC chip mounting area than in the vibrating element mounting area, and
the IC chip mounting surface is located closer to a rear surface side of the bottom portion than the vibrating element mounting surface, the rear surface side being with respect to the mounting surfaces of the IC chip and the vibrating element.

2. The vibrating device according to claim 1, wherein the thickness of the vibrating element is smaller than that of the IC chip.

3. The vibrating device according to claim 1, wherein the vibrating element is supported at both sides thereof on the vibrating element mounting surface.

4. The vibrating device according to claim 1, wherein the bottom portion has a recess which is opened in the vibrating element mounting surface and prevents contact with the vibrating element.

5. The vibrating device according to claim 1, wherein the vibrating element has a vibrating portion which vibrates, and
the vibrating element mounting surface includes, in the planar view of the bottom portion, a recess which includes in the interior thereof at least one portion of the vibrating portion.

6. The vibrating device according to claim 1, wherein the bottom portion has a regulating portion which regulates displacement of the vibrating element toward the thickness direction.

7. The vibrating device according to claim 6, wherein at least one portion of the regulating portion faces a base portion of the vibrating element.

8. The vibrating device according to claim 1, further comprising a buffer layer disposed between the vibrating element mounting surface and the vibrating element.

9. The vibrating device according to claim 1, wherein
a through-hole which communicates between the interior and exterior of the accommodating space is disposed in the bottom portion, and
the through-hole is disposed, in the planar view of the bottom portion, on the side opposite to the vibrating element via the IC chip.

10. The vibrating device according to claim 9, wherein
the through-hole is disposed in a thicker area of the bottom portion than the IC chip mounting area.

11. The vibrating device according to claim 1, wherein
the vibrating element is a gyro element which detects an angular velocity.

12. An electronic apparatus comprising the vibrating device according to claim 1.

* * * * *